US00RE42653E

(19) United States
(12) Reissued Patent
Huang

(10) Patent Number: US RE42,653 E
(45) Date of Reissued Patent: Aug. 30, 2011

(54) SEMICONDUCTOR PACKAGE WITH HEAT DISSIPATING STRUCTURE

(75) Inventor: Chien-Ping Huang, Taichung (TW)

(73) Assignee: Siliconware Precision Industries Co., Ltd., Taichung (TW)

(21) Appl. No.: 12/722,009

(22) Filed: Mar. 11, 2010

Related U.S. Patent Documents

Reissue of:
(64) Patent No.: 7,342,304
Issued: Mar. 11, 2008
Appl. No.: 10/787,269
Filed: Feb. 25, 2004

U.S. Applications:
(62) Division of application No. 10/211,430, filed on Aug. 2, 2002, now Pat. No. 6,720,649.

(30) Foreign Application Priority Data

Dec. 7, 2001 (TW) ..... 90221335

(51) Int. Cl.
*H01L 23/10* (2006.01)
*H01L 23/34* (2006.01)

(52) U.S. Cl. ..... 257/706; 257/675; 257/707

(58) Field of Classification Search ..... 257/706, 257/707, 675
See application file for complete search history.

(56) References Cited

U.S. PATENT DOCUMENTS 5,397,917 A 3/1995 Ommen et al.
5,468,910 A 11/1995 Knapp et al.
5,543,663 A 8/1996 Takubo
5,652,461 A 7/1997 Ootsuki et al.
5,736,785 A * 4/1998 Chiang et al. ..... 257/712
5,977,626 A * 11/1999 Wang et al. ..... 257/707
5,982,621 A 11/1999 Li
6,229,702 B1 5/2001 Tao et al.
6,246,115 B1 * 6/2001 Tang et al. ..... 257/706
6,359,341 B1 3/2002 Huang et al.
6,369,455 B1 4/2002 Ho et al.
6,462,405 B1 10/2002 Lai et al.
6,552,428 B1 4/2003 Huang et al.
6,580,167 B1 * 6/2003 Glenn et al. ..... 257/718
6,720,649 B2 * 4/2004 Huang ..... 257/706
6,777,819 B2 * 8/2004 Huang ..... 257/796
2002/0113308 A1 * 8/2002 Huang et al. ..... 257/717

* cited by examiner

*Primary Examiner* — Phat X Cao
(74) *Attorney, Agent, or Firm* — Peter F. Corless; Steven M. Jensen; Edwards Angell Palmer & Dodge LLP

(57) ABSTRACT

A semiconductor package with a heat dissipating structure is provided. The heat dissipating structure includes a flat portion, and a plurality of support portions formed at edge corners of the flat portion for supporting the flat portion above a chip mounted on a substrate. The support portions are mounted at predetermined area on the substrate without interfering with arrangement of the chip and bonding wires that electrically connect the chip to the substrate. The support portions are arranged to form a space embraced by adjacent supports and the flat portion, so as to allow the bonding wires to pass through the space to reach area on the substrate outside coverage of the heat dissipating structure; besides, passive components or other electronic components can be mounted on the substrate at area within or outside the coverage of the heat dissipating structure, thereby improving flexibility in component arrangement in the semiconductor package.

32 Claims, 5 Drawing Sheets

SEMICONDUCTOR PACKAGE WITH HEAT DISSIPATING STRUCTURE

Matter enclosed in heavy brackets [ ] appears in the original patent but forms no part of this reissue specification; matter printed in italics indicates the additions made by reissue.

CROSS-REFERENCE TO RELATED APPLICATION(S)

This application is a divisional of application U.S. Ser. No. 10/211,430, filed on Aug. 2, 2002 now U.S. Pat. No. 6,720,649.

FIELD OF TIE INVENTION

The present invention relates to semiconductor packages, and more particularly, to a semiconductor package with a heat dissipating structure.

BACKGROUND OF TIE INVENTION

Ball grid array (BGA) semiconductor packages are mainstream package products in the light of providing a sufficient amount of I/O (input/output) connections for use with semiconductor chips that incorporate high density of electronic elements and electronic circuits. As such a highly-integrated chip operates to consequently produce relatively more heat, it is thereby important to promptly remove the heat from the chip; otherwise, heat accumulation in the chip would undesirably damage electrical performances and reliability of package products. Moreover, for protecting internal components of the semiconductor package against external contamination, it usually forms an encapsulant that encapsulates the chip and other conductive elements such as bonding wires. The encapsulant is made of a resin material with poor thermal conductivity (coefficient of thermal conductivity around 0.8w/m°K); therefore, the chip-generated heat would not be efficiently dissipated to the atmosphere through the encapsulant; this would thereby adversely affect performances and lifetime of the chip by virtue of heat accumulation.

In response to the above heat-dissipation, problem, there is adopted a heat dissipating structure in the BGA semiconductor package for facilitating dissipation of heat generated from the chip. However, this heat dissipating structure is embedded in the encapsulant, such that the chip-generated heat still needs to pass through the encapsulant for dissipation. Therefore, this structural arrangement cannot achieve satisfactory improvement in heat dissipating efficiency for the semiconductor package.

Accordingly, U.S. Pat. No. 5,977,626 discloses a semiconductor package with a heat dissipating structure being partly exposed to the atmosphere and also directly contacting with a chip. As shown in FIGS. 5 and 6, in this semiconductor package 3, a heat dissipating structure 33 is provided on a substrate 30 above a chip 31 mounted on the substrate 30. The heat dissipating structure 33 comprises: a flat portion 330 having a top face 330a exposed to outside of an encapsulant 34 that encapsulates the chip 31 and bonding wires 32 that electrically connect the chip 31 to the substrate 30; and a single encircled support portion 331 peripherally situated at the flat portion 330 and extending downwardly from a bottom surface 330b of the flat portion 330 to be attached to the substrate 30, wherein the flat portion 330 and the encircled support portion 331 integrate to form a receiving space 35 where internal components such as the chip 31, bonding wires 32 and passive components (not shown) are placed. The encircled support portion 331 is integrally formed with a laterally-extending contact portion 332 at a bottom position thereof, and the contact portion 332 may be provided with a plurality of protruding portions 333 respectively extending downwardly to be attached to the substrate 30. Moreover, on the bottom surface 330b of the flat portion 330 there is formed a protrusion 334 extending to abut against an active surface 310 of the chip 31. This allows heat generated by the chip 31 during operation to be transmitted through the protrusion 334 to the exposed top face 330a of the flat portion 330 by which the heat can be dissipated to the atmosphere, so as to provide excellent heat dissipating efficiency for the semiconductor package 3.

However, the above semiconductor package 3 has significant drawbacks. In compliance with low profile packaging technology and high integration of chip development, substrates are preferred to be down-sized nearly to chip scale, and incorporated with sufficient conductive elements such as bonding wires required for accommodating highly-integrated chips with densely-arranged electronic elements or circuits. As a result, the above heat dissipating structure 33 is considered to occupy too much space on the substrate 30 in a manner that, the receiving space 35 embraced by the flat portion 330 and the single encircled support portion 331 with integrally-formed contact portion 332, makes all internal components of the semiconductor package 3 position-restrictedly enclosed in the receiving space 35. Thereby, the bonding wires 32, passive components or other electronic components (not shown) can only be disposed on the substrate 30 at area within coverage of the heat dissipating structure 33 in the receiving space 35. This drawback makes the semiconductor package 3 with the heat dissipating structure 33 hardly applied for accommodating highly-integrated chips that require a large amount of active and passive components as well as conductive elements to be comfortable situated on the substrate 30 for achieving desirable operational and electrical performances.

Further due to the heat dissipating structure 33 being located outside area for incorporating electronic components on the substrate 30, in another aspect, the substrate 30 may need to be increasingly sized in order to dispose a sufficient number of active and passive components as well as conductive elements on the substrate 30; this would make the substrate 30 considerably larger in size than the chip 31, thereby unfavorable to profile miniaturization.

SUMMARY OF TIE INVENTION

An objective of the present invention is to provide a semiconductor package with a heat dissipating structure, wherein the heat dissipating structure is arranged in a manner not to interfere with layout of a chip, bonding wires or passive components mounted on the substrate, thereby improving flexibility in component arrangement in the semiconductor package.

Another objective of the invention is to provide a semiconductor package with a heat dissipating structure, so as to reduce surface area of a substrate occupied by the heat dissipating structure, and thus to increase layout area on the substrate for accommodating bonding wires and passive components.

A further objective of the invention is to provide a semiconductor package with a heat dissipating structure, so as to improve heat dissipating efficiency of the semiconductor package.

To achieve the above and other objectives, the present invention proposes a semiconductor package with a heat dissipating structure, comprising: a substrate; at least a chip mounted on the substrate and electrically connected to the substrate via a plurality of bonding wires; a heat dissipating structure comprising a flat portion, and a plurality of support portions formed at edges of the flat portion for supporting the flat portion in position above the chip, wherein the support portions are mounted at predetermined area on the substrate to be free of interference with arrangement of the chip and the bonding wires, and the support portions are arranged to form a space embraced by adjacent support portions and the flat portion, which space is dimensioned to accommodate the bonding wires and to allow the bonding wires to pass through the space to reach area on the substrate outside coverage of the heat dissipating structure; an encapsulant formed on the substrate for encapsulating the chip and the bonding wires; and a plurality of solder balls implanted on the substrate and exposed to outside of the encapsulant.

In the above package structure, the flat portion of the heat dissipating structure is elevated above the chip by the support portions and forms a predetermined height difference with respect to the substrate, wherein the height difference is at least corresponding to height of wire loops of the bonding wires. Therefore, part of bond fingers where the bonding wires are bonded can be formed on the substrate at area outside the coverage of the heat dissipating structure, allowing the corresponding bonding wires to pass through the space embraced by adjacent support portions and the flat portion and to reach the outside-coverage bond fingers. Besides, passive components or other electronic components may also be desirably mounted on the substrate at area within or outside the coverage of the heat dissipating structure, thereby improving flexibility in component arrangement in the semiconductor package. Moreover, by the above structural arrangement, more flexibly-sized heat dissipating structures or chips can be adopted in the semiconductor package as long as the support portions of the heat dissipating structure are mounted on the substrate at area without affecting the arrangement of the chip and the bonding wires. Furthermore, the heat dissipating structure with multiple individual support portions, instead of a conventional single encircled support portion (as shown in FIG. 6), can desirably reduce surface area of the substrate occupied by the heat dissipating structure, thereby increasing layout area on the substrate for accommodating the bonding wires, passive components or other electronic components.

In another embodiment, the flat portion of the heat dissipating structure, having a top surface exposed to outside of the encapsulant and a bottom surface connected to the support portions, is formed with at least a peripherally-situated recess on the top surface and at least a protrusion on the bottom surface. During a molding process for forming the encapsulant by an encapsulating resin, when flowing to the peripherally-situated recess, the encapsulating resin would quickly absorb heat from an encapsulating mold and slow down its flowing speed without flashing over the exposed top surface of the flat portion, thereby helping assure reliability of fabricated package products. Moreover, the protrusion formed on the flat portion extends toward the chip mounted on the substrate and shortens the distance between the flat portion and the chip, by which heat generated from the chip can be efficiently transmitted to the heat dissipating structure for dissipation, such that heat dissipating efficiency of the semiconductor package is desirably improved.

DETAILED DESCRIPTION OF THE PREFERRED EMBODIMENTS

Figure 1:
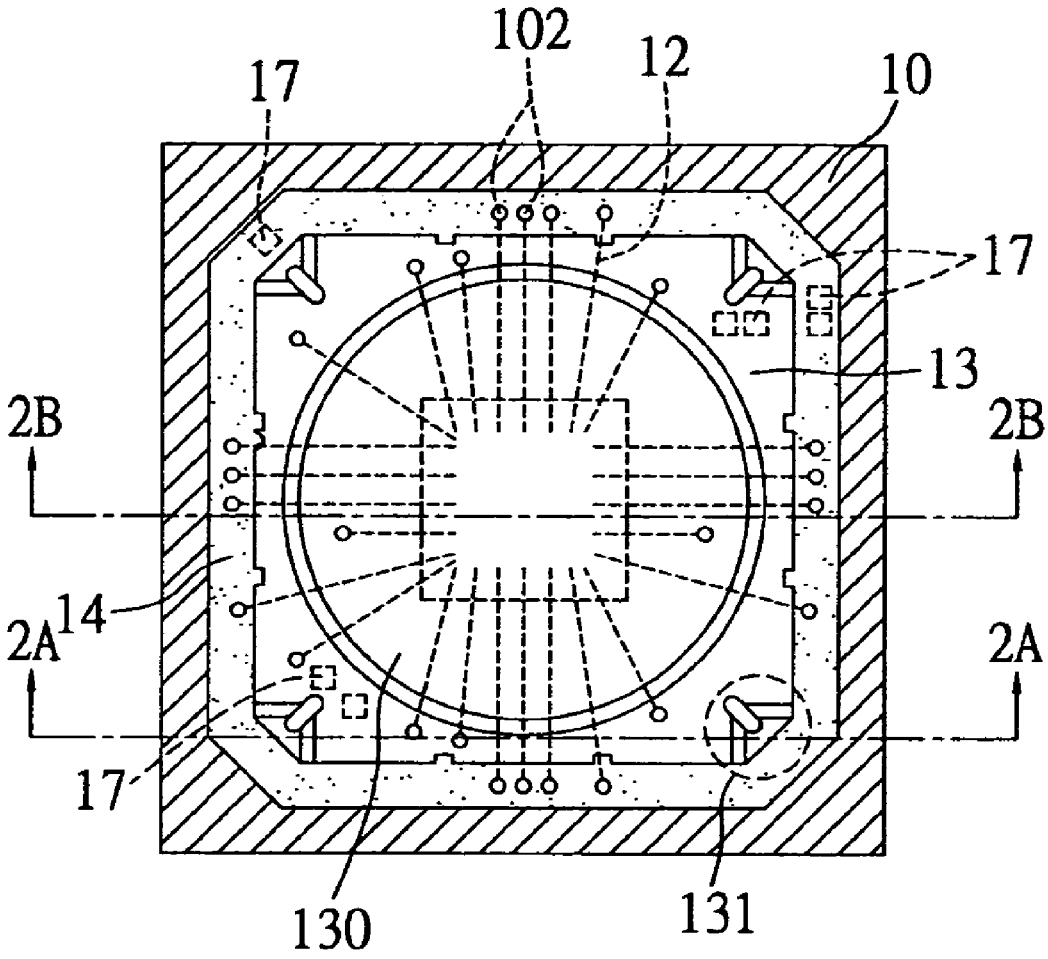
FIG. 1 is a top perspective view of a semiconductor package according to a preferred embodiment of the present invention.
Figure 2A:
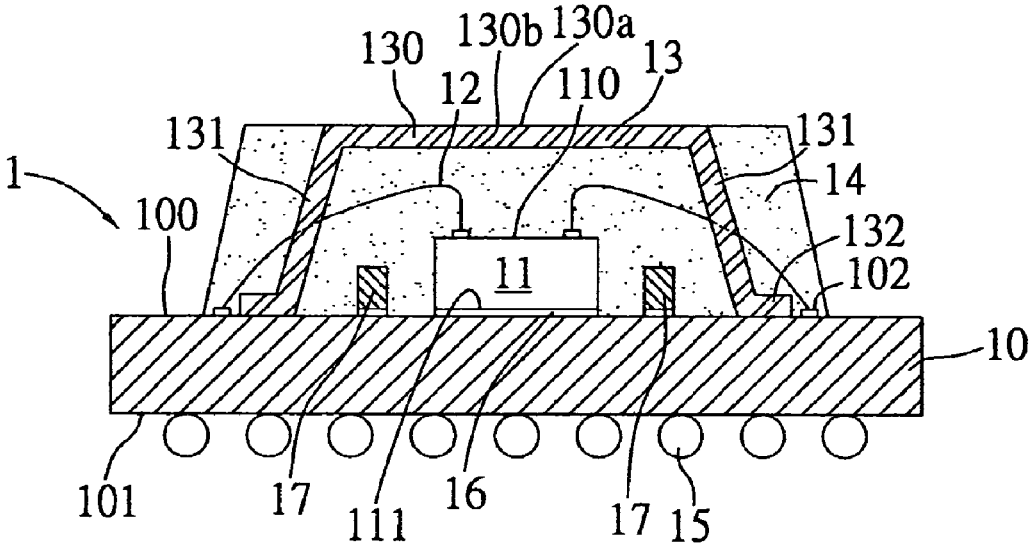
FIG. 2A is a cross-sectional view of the semiconductor package shown in FIG. 1 taken along line 2A-2A.
Figure 2B:
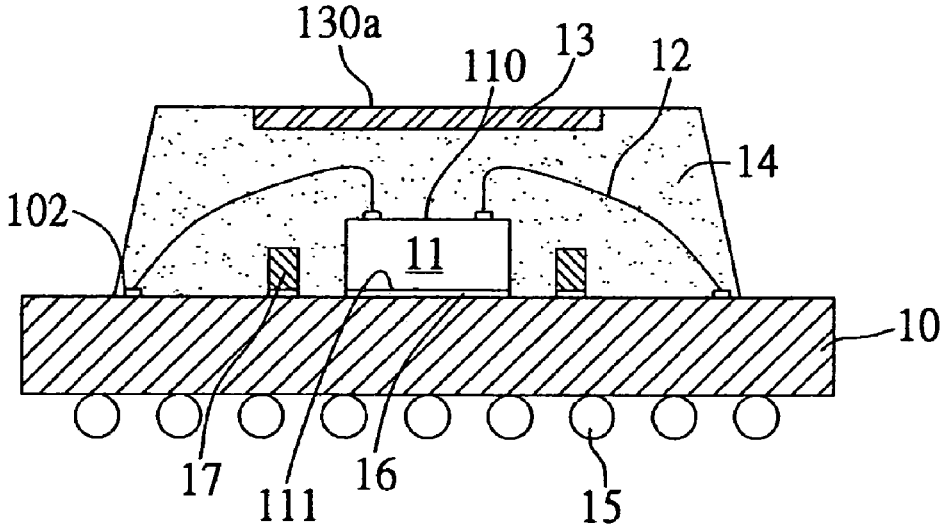
FIG. 2B is a cross-sectional view of the semiconductor package shown in FIG. 1 taken along line 2B-2B.

FIGS. 1, 2A and 2B illustrate a semiconductor package 1 proposed in the present invention, wherein FIGS. 2A and 2B are cross-sectional views of the semiconductor package 1 shown in FIG. 1. As shown in the drawings, the semiconductor package 1 comprises: a substrate 10; a chip 11 mounted on the substrate 10; a plurality of bonding wires 12 for electrically connecting the chip 11 to the substrate 10; a heat sink 13 mounted on the substrate 10; a plurality of passive components 17 disposed on the substrate 10; an encapsulant 14 for encapsulating the chip 11, bonding wires 12, heat sink 13 and passive components 17; and a plurality of solder balls 15 implanted on the substrate 10 and exposed to outside of the encapsulant 14.

The substrate 10 has a top surface 100 and a bottom surface 101 opposed to the top surface 100, each surface being formed with predetermined conductive traces (not shown) thereon. A plurality of conventional vias (not shown) are formed through the substrate 10 for electrically interconnecting the conductive traces on the top and bottom surfaces 100, 101. The substrate 10 may be made of epoxy resin, polyimide resin, BT (bismaleimide triazine) resin, ceramic material, glass material, etc., and preferably BT resin.

A plurality of bond fingers 102 are formed and associated with corresponding conductive traces on the top surface 100 of the substrate 10, so as to allow the bonding wires 12 to be bonded to the bond fingers 102 respectively. The passive components 17, such as inductor, capacitor, resister, etc., are mounted on the top surface 100 of the substrate for modulating electrical performances in operation of the semiconductor package 1. The solder balls 15 are implanted on the bottom surface 101 of the substrate 10 at positions associated with corresponding conductive traces, and used to electrically connect the chip 11 to an external device such as a printed circuit board (PCB, not shown).

The chip 11 has an active surface 110 formed with a plurality of electric elements and electric circuits thereon, and a non-active surface 111 opposed to the active surface 110, wherein the non-active surface 111 is mounted on the top surface 100 of the substrate 10 by an adhesive 16 such as silver paste or a polyimide tape.

Figure 3:
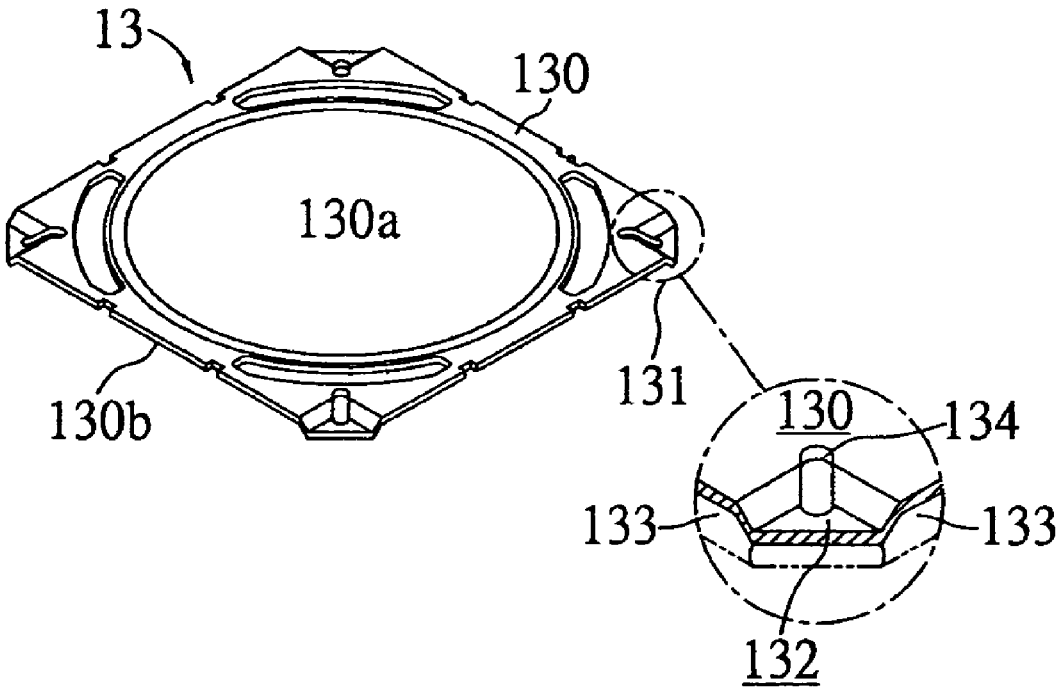
FIG. 3 is a top view and a local enlarged view of a heat dissipating structure used in the semiconductor package according to the invention.

In accompany with reference to FIG. 3, the heat sink 13, a characteristic feature of the invention, is an embedded type of heat sink mounted on the top surface 100 of the substrate 10 at conductive-element-free area without interfering with arrangement of the bond fingers 102, bonding wires 12 and passive components 17. The heat sink 13 comprises a flat portion 130, and a plurality of support portions 131 for elevating the flat portion 130 in position above the chip 11. The flat portion 130 has a top surface 130a and a bottom surface 130b opposed to the top surface 130a, wherein the top surface 130a is exposed to outside of the encapsulant 14, and the bottom surface 130b is formed with the support portions 131. The support portions 131 are situated at edge corners of the flat portion 130, and extend downwardly to be attached to the top surface 100 of the substrate 10. The flat portion 130 elevated by the support portions 131 is adapted to form a predetermined height difference with respect to the substrate 100 in a manner as to form a space 133 embraced by adjacent support portions 131 and the flat portion 130, wherein the space 133 is dimensioned to accommodate wire loops of the bonding wires 12 and the passive components 17 and to allow the bonding wires 12 to pass through the space 133 to reach area on the substrate 10 outside coverage of the heat sink 13. For example, bond fingers 102 formed on the substrate can be situated at area outside the coverage of the heat sink 13, allowing the corresponding bonding wires 12 to be bonded to the outside-coverage bond fingers 102 in a manner shown in FIG. 2A; moreover, the passive components 17 or other electronic components can also be desirably disposed on the area of the substrate 10 outside the coverage of the heat sink 13; this thereby improves flexibility in component arrangement in the semiconductor package 1.

Each of the support portions 131 may be formed with a contact portion 132 at a position in contact with the substrate 10, wherein the contact portion 132 substantially extends laterally with respect to the substrate 10. The contact portion 132 may be flexibly shaped as, but not limited to, a rectangle, triangle, semicircle, etc. Each of the support portions 131 may be further formed with at least a hole 134 (as shown in FIG. 3) for allowing an encapsulating resin used for forming the encapsulant 14 to pass through the hole 134 during a molding process, so as to enhance bonding strength between the heat sink 13 and the fabricated encapsulant 14.

Figure 6:
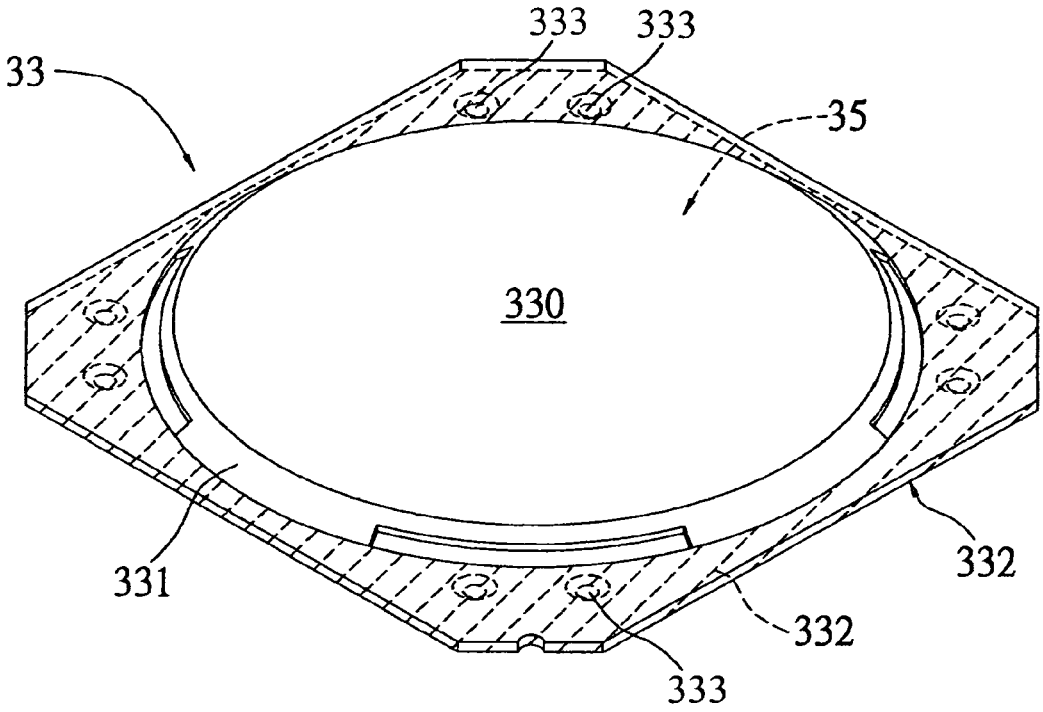
FIG. 6 (PRIOR ART)
FIG. 6 (PRIOR ART) is a top view of a heat dissipating structure used in the semiconductor package shown in FIG. 5.

Moreover, by the above structural arrangement, more flexibly-sized heat sinks 13 or chips 11 can be adopted in the semiconductor package 1 as long as the support portions 131 of the heat sink 13 are mounted on the substrate 10 at area without affecting the arrangement of the chip 11 and the bonding wires 12. Furthermore, the heat sink 13 with multiple individual support portions 131, instead of a conventional single encircled support portion (as shown in FIG. 6), can desirably reduce surface area of the substrate 10 occupied by the heat sink 13, thereby increasing layout area on the substrate 10 for accommodating the bonding wires 12, passive components 17 or other electronic components.

Figure 4:
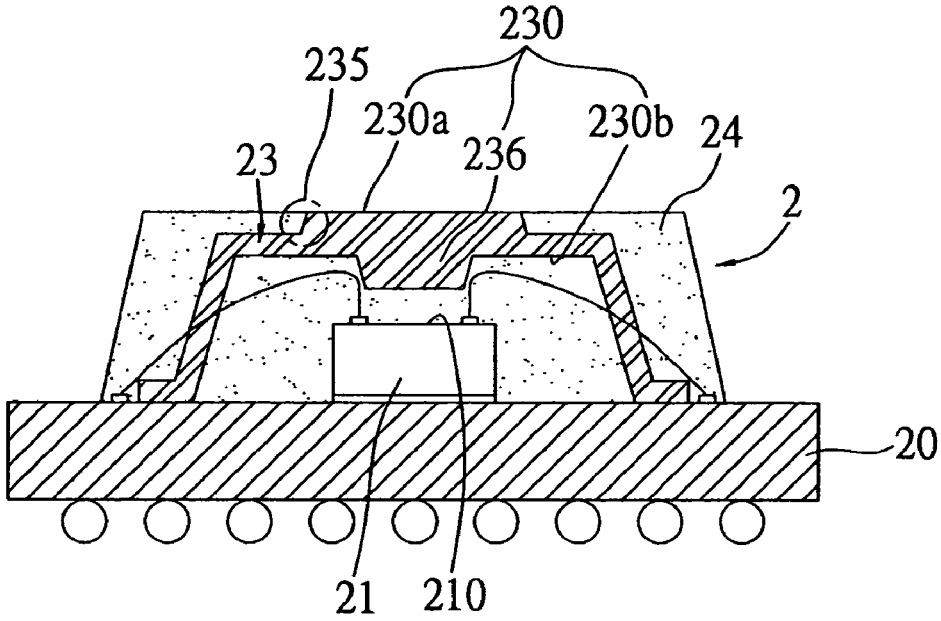
FIG. 4 is a cross-sectional view of the semiconductor package according to another preferred embodiment of the invention.
Figure 5:
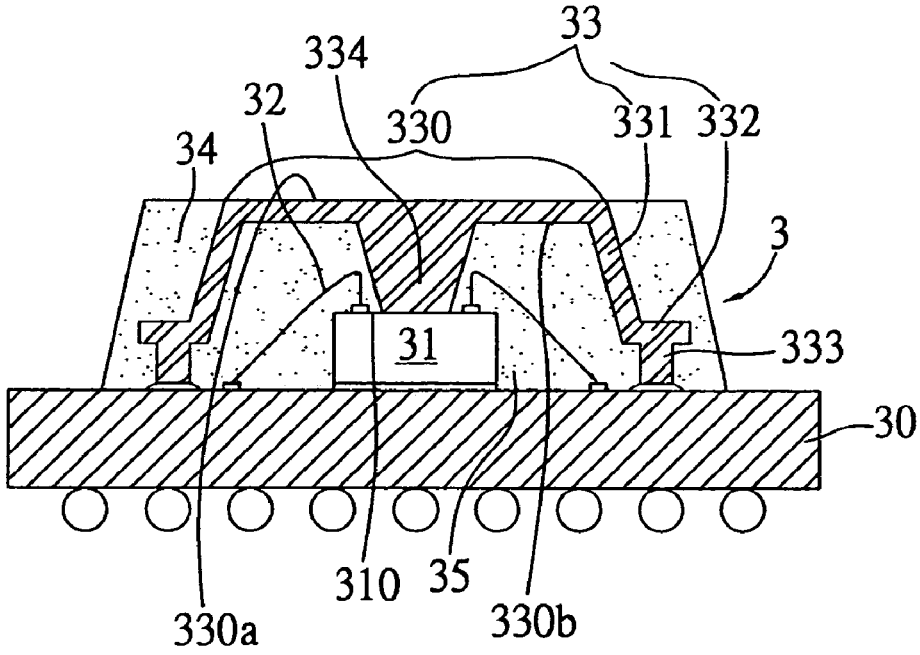
FIG. 5 (PRIOR ART)
FIG. 5 (PRIOR ART) is a cross-sectional view of a semiconductor package according to U.S. Pat. No. 5,977,626.

FIG. 4 illustrates a semiconductor package 2 according to another preferred embodiment of the invention. This semiconductor package 2 is substantially similar to the semiconductor package 1 described in the foregoing embodiment. A difference in the semiconductor package 2 is that, at least a peripherally-situated recess 235 is formed on a top surface 230a of a flat portion 230 of a heat sink 23. During a molding process for forming an encapsulant 24 by an encapsulating resin, when flowing to the peripherally-situated recess 235, the encapsulating resin would quickly absorb heat from an encapsulating mold (not shown) and reduce its flowing speed without flashing over the exposed top surface 230a. Moreover, at least a protrusion 236 may be formed on a bottom face 230b of the flat portion 230 and extends toward a chip 21 mounted on a substrate 20 and shortens the distance between the flat portion 230 and an active surface 210 of the chip 21, by which heat generated from the chip 21 can be efficiently transmitted to the heat sink 23 for dissipation, such that heat dissipating efficiency of the semiconductor package 2 is desirably improved.

The present invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A heat dissipating structure for a semiconductor package having a substrate, at least a chip mounted on the substrate and electrically connected to the substrate via a plurality of conductive elements, and one or more passive components mounted on the substrate, the heat dissipating structure comprising:

a flat portion, wherein at least a peripherally-situated recess is formed on a top surface of the flat portion; and a plurality of support portions formed at edge corners of the flat portion and outmost corners of the heat dissipating structure for supporting the flat portion in position above the chip, each of the support portions further comprising at least two panels and a contact portion formed between the panels at a respective outmost corner of the heat dissipating structure, wherein the support portions are mounted at a predetermined area on the substrate and free of interference with an arrangement of the chip, the passive components and the conductive elements, and the support portions are arranged to form a space between two adjacent support portions, the space being sufficiently dimensioned to accommodate the conductive elements and the passive components so as to allow the conductive elements to pass through the space to reach an area on the substrate outside coverage of the heat dissipating structure and such that the passive components are located within and/or outside the coverage of the heat dissipating structure.

2. The heat dissipating structure of claim 1, wherein the conductive elements are bonding wires, and a plurality of bond fingers are formed on the substrate for allowing the bonding wires to be bonded to the bond fingers.

3. The heat dissipating structure of claim 2, wherein the flat portion is elevated above the chip by the support portions and forms a predetermined height difference with respect to the substrate, allowing the height difference to be larger than a height of wire loops of the bonding wires.

4. The heat dissipating structure of claim 3, wherein part of the bond fingers are situated on the substrate at an area outside the coverage of the heat dissipating structure, allowing the corresponding bonding wires to pass through the space embraced by adjacent support portions and the flat portion and to reach the outside-coverage bond fingers.

5. The heat dissipating structure of claim 1, wherein the support portions are situated at edge corners of the flat portion.

6. The heat dissipating structure of claim 1, wherein the chip and the conductive elements are encapsulated by an encapsulant formed on the substrate.

7. The heat dissipating structure of claim 6, wherein the flat portion has a top surface exposed to outside of the encapsulant, and a bottom surface opposed to the top surface, the bottom surface being formed with the support portions.

8. The heat dissipating structure of claim 7, wherein at least a protrusion is formed on the bottom surface of the flat portion and extends toward the chip.

9. The heat dissipating structure of claim 1, wherein each of the support portions is formed with at least a hole for allowing an encapsulating resin used for forming the encapsulant to pass through the hole.

10. The heat dissipating structure of claim 1, wherein each of the support portions is formed with a contact portion at a position in contact with the substrate.

11. The heat dissipating structure of claim 10, wherein the contact portion substantially extends laterally with respect to the substrate.

12. The heat dissipating structure of claim 10, wherein the contact portion is of a triangular, rectangular or semicircular shape.

13. A heat dissipating structure for a semiconductor package having a plurality of conductive elements and one or more passive components, comprising:

a flat portion having a top surface and a bottom surface opposed to the top surface, wherein at least a peripherally-situated recess is formed on the top surface of the flat portion; and a plurality of support portions formed at edge corners of the bottom surface of the flat portion and outmost corners of the heat dissipating structure, each of the support portions further comprising at least two panels and a contact portion formed between the panels at a respective outmost corner of the heat dissipating structure, wherein the support portions are arranged to form a space between two adjacent support portions, and the space is sufficiently dimensioned to accommodate the conductive elements and the passive components.

14. The heat dissipating structure of claim 13, wherein the conductive elements are bonding wires, such that the space is dimensioned to have a predetermined height larger than a height of wire loops of the bonding wires.

15. The heat dissipating structure of claim 13, wherein at least a protrusion is formed on the bottom surface of the flat portion.

16. The heat dissipating structure of claim 13, wherein the top surface of the flat portion is exposed to outside of the semiconductor package.

17. The heat dissipating structure of claim 13, wherein each of the support portions is formed with at least a hole for allowing an encapsulating resin used in the semiconductor package to pass through the hole.

18. The heat dissipating structure of claim 13, wherein each of the support portions has one end attached to the flat portion and the other end formed with a contact portion.

19. The heat dissipating structure of claim 18, wherein the contact portion substantially extends laterally with respect to the flat portion.

20. The heat dissipating structure of claim 18, wherein the contact portion is of a triangular, rectangular or semicircular shape.

21. A heat dissipating structure for a semiconductor package having a plurality of bonding wires and one or more passive components, comprising:

a flat portion having a top surface and a bottom surface opposed to the top surface, wherein at least a peripherally-situated recess is formed on the top surface of the flat portion; and a plurality of support portions formed at edge corners of the bottom surface of the flat portion and outmost corners of the heat dissipating structure, each of the support portions further comprising at least two panels and a contact portion formed between the panels at a respective outmost corner of the heat dissipating structure, wherein the support portions are arranged to form a space between two adjacent support portions, and the space is dimensioned to have a predetermined height larger than a height of wire loops of the bonding wires and a height of the passive components.

22. The heat dissipating structure of claim 21, wherein at least a protrusion is formed on the bottom surface of the flat portion.

23. The heat dissipating structure of claim 21, wherein the top surface of the flat portion is exposed to outside of the semiconductor package.

24. The heat dissipating structure of claim 21, wherein each of the support portions is formed with at least a hole for allowing an encapsulating resin used in the semiconductor package to pass through the hole.

25. The heat dissipating structure of claim 21, wherein each of the support portions has one end attached to the flat portion and the other end formed with a contact portion.

26. The heat dissipating structure of claim 24, wherein the contact portion substantially extends laterally with respect to the flat portion.

27. The heat dissipating structure of claim 24, wherein the contact portion is of a triangular, rectangular or semicircular shape.

*28. A heat dissipating structure for a semiconductor package having a plurality of bonding wires, comprising:*

*a flat portion having a top surface and a bottom surface opposed to the top surface, wherein at least a peripherally-situated recess is formed on the top surface of the flat portion; and*

*a plurality of support portions formed at edge corners of the bottom surface of the flat portion and outmost corners of the heat dissipating structure, each of the support portions further comprising:*

*a connecting portion including at least two panels; and*

*a contact portion formed between the panels at a respective outmost corner of the heat dissipating structure, the contact portion being connected to the flat portion via the connecting portion,*

*wherein the support portions are arranged to form a space between two adjacent support portions, and the space is dimensioned to have a predetermined height larger than a height of wire loops of the bonding wires.*

*29. The heat dissipating structure of claim 28, wherein the connecting portion has a first end attached to the flat portion and a second end connected with the contact portion.*

*30. The heat dissipating structure of claim 28, wherein the contact portion substantially extends laterally with respect to the flat portion.*

*31. The heat dissipating structure of claim 28, wherein the space between the two adjacent support portions is configured to accommodate one or more passive components, such that the one or more passive components are located within a coverage of the heat dissipating structure.*

*32. The heat dissipating structure of claim 28, wherein the space between the two adjacent support portions is configured to accommodate one or more passive components, such that the one or more passive components are located outside a coverage of the heat dissipating structure.*

* * * * *